(12) United States Patent
Smith

(10) Patent No.: US 7,768,648 B2
(45) Date of Patent: Aug. 3, 2010

(54) METHOD FOR ABERRATION EVALUATION IN A PROJECTION SYSTEM

(76) Inventor: Bruce W. Smith, 22 Mt. Eagle Dr., Penfield, NY (US) 14526

( * ) Notice: Subject to any disclaimer, the term of this patent is extended or adjusted under 35 U.S.C. 154(b) by 636 days.

(21) Appl. No.: 11/559,454

(22) Filed: Nov. 14, 2006

(65) Prior Publication Data

US 2007/0070320 A1 Mar. 29, 2007

Related U.S. Application Data

(63) Continuation-in-part of application No. 10/734,462, filed on Dec. 12, 2003, now Pat. No. 7,136,143.

(60) Provisional application No. 60/433,153, filed on Dec. 13, 2002.

(51) Int. Cl.
*G01N 21/55* (2006.01)
(52) U.S. Cl. .................................... 356/448
(58) Field of Classification Search .......... None
See application file for complete search history.

(56) References Cited

U.S. PATENT DOCUMENTS 6,552,776 B1 * 4/2003 Wristers et al. ............ 355/67
6,839,132 B2 * 1/2005 Fukuhara et al. .......... 356/124
2003/0091913 A1 * 5/2003 Shiode ...................... 430/22
2003/0098970 A1 * 5/2003 Chen ......................... 356/124
2003/0147061 A1 * 8/2003 Omura ....................... 355/67
2003/0203319 A1 * 10/2003 Lee ............................ 430/314

* cited by examiner

*Primary Examiner*—Gregory J Toatley, Jr.
*Assistant Examiner*—Juan D Valentin
(74) *Attorney, Agent, or Firm*—Hiscock & Barclay, LLP

(57) ABSTRACT

Aberrations in an optical system can be detected and measured using a method comprised of a test target in the object plane of a projection system and imaging onto the image plane with the system. The test target comprises at least one open figure which comprises a multiple component array of phase zones, where the multiple zones are arranged within the open figure so that their response to lens aberration is interrelated and the zones respond uniquely to specific aberrations depending on their location within the figure. This is a unique and new method of detecting a variety of aberration types including coma, spherical, astigmatism, and three-point through the imaging onto photosensitive material or image detector placed in the image plane of the system and the evaluation of these images. The method of the invention offers an advantage over other methods because of the sensitivity to particular aberration types, the unique response of the multiple zones of the test target to aberrations, and the ease with which aberrations can be distinguished.

26 Claims, 24 Drawing Sheets

-3rd order astigmatism

Focus +/- 0.12 μm

+3rd order astigmatism

Focus +/- 0.12 μm

+3rd order 45° astigmatism

Focus +/- 0.12 μm

-3rd order 45° astigmatism

Focus +/- 0.12 μm

−3rd order spherical

Focus -0.16 -0.12 +0.12 +0.16 μm

+3rd order spherical

Focus -0.16 -0.12 +0.12 +0.16 μm

+3rd order X 3-foil    -3rd order X 3-foil

+3rd order Y 3-foil    -3rd order Y 3-foil

METHOD FOR ABERRATION EVALUATION IN A PROJECTION SYSTEM

CROSS REFERENCE TO RELATED APPLICATIONS

This application is a Continuation in Part of U.S. patent application Ser. No. 10/734,462 filed Dec. 12, 2003, which claims the benefit of the priority date of U.S. Provisional patent application Ser. No. 60/433,153 filed Dec. 13, 2002.

FIELD OF THE INVENTION

The present invention relates to aberration evaluation of a projection imaging system.

BACKGROUND OF THE INVENTION

Optical lithography has been the dominant technology for the patterning of semiconductor device features. As the size of the geometry for these devices continue to shrink below the ultraviolet (UV) wavelength used for imaging, significant demands are placed on the quality of the optical component within the projection imaging system. Projection systems used for microlithographic imaging or micro-optical inspection comprise a large number of lens elements and operate at wavelengths ranging from 436 nm to 126 nm. The level of aberration in these systems must be low enough to allow imaging on the order of 0.30 lambda/NA, where lambda is the imaging wavelength and NA is the numerical aperture of the lens system, typically on the order of 0.40 to 1.2. This type of performance is near the physical limits of diffraction and aberrations must be low enough to produce optical wavefront deformation in the projection lens pupil below a multiple of 0.1 wavelengths, and approaching 0.001 wavelengths for the most advanced systems.

Lens quality can be described in terms of the ability of an optical system to convert the spherical wavefront emerging from an object point into a spherical wavefront converging toward an image point. Each aberration type will produce unique deviations in the wavefront within the lens pupil.

For a system utilizing full circular pupils, Zernike circle polynomials can be used to represent optimally balanced classical aberrations. Any term in the expansion of the wave aberration function leading to a complete set of Zernike polynomials can be represented as:

$$W(\rho, \theta) = \sum_{n=0}^{\infty} \sum_{m=0}^{n} \sqrt{2(n+1)/(1+\delta_{m0})} \, R_n^m(\rho)[c_{nm}\cos(m\theta) + s_{nm}\sin(m\theta)]$$

where n and m are positive integers (n−m≧0 and even), $c_{nm}$ and $s_{nm}$ are aberration coefficients, and the radial polynomial R of degree n in terms of the normalized radial coordinate in the pupil plane ($\rho$) is in Mahajan's convention [V. N. Mahajan, *Zernike circular polynomials and optical aberrations of systems with circular pupils*, Eng. and Lab Notes, in Opt. & Phot. News 5, 8 (1994)]. Commonly, a set of 37 Zernike polynomial coefficients is utilized to describe primary and higher order aberration, although some applications may require additional terms.

Since any amount of aberration results in image degradation, tolerance levels must be established for lens system, dependent on application. This results in the need to consider not only specific object requirements and illumination but also process requirements. Conventionally, an acceptably diffraction limited lens is one which produces no more than one quarter wavelength ($\lambda/4$) wavefront OPD. For many lens systems, the reduced performance resulting from this level of aberration may be allowable. This Rayleigh $\lambda/4$ rule is not suitable however for high resolution applications such as microlithographic imaging or micro-optical inspection applications. To establish allowable levels of aberration tolerances for a these applications, application specific analysis must be performed. Detector requirements need to be considered along with process specifications. As an example, the current needs of UV and DUV lithography require a balanced aberration level below 0.03$\lambda$ OPD RMS. Future requirements will dictate sub-0.01$\lambda$ performance. More important, however, may not be the full pupil performance but instead the performance over the utilized portion of the pupil for specific imaging situations [B. W. Smith, *Variations to the influence of lens aberration invoked with PSM and OAI*. Proc. SPIE 3679 (1999)].

Aberration metrology is critical to the production of micro-optical quality projection lenses in order to meet these strict requirements. Additionally, it is becoming increasingly important to be able to measure and monitor lens performance in an application environment. The user needs to understand the influences of aberration on imaging and any changes that may occur in the aberration performance of the lens between lens assembly and application or over the course of using an exposure tool.

The most accurate method of measuring wavefront aberration (and subsequently fitting coefficients of Zernike polynomials) is phase measurement interferometry (PMI), also known as phase shifting interferometry (PSI) [J. E. Greivenkamp and J. H. Bruning, Optical Shop Testing: Phase Shifting Interferometry, D. Malacara ed, (1992) 501]. PMI generally describes both data collection and the analysis methods that have been highly developed for lens fabrication and assembly and used by all major lithographic lens suppliers. The concept behind PMI is that a time-varying phase shift is introduced between a reference wavefront and a test wavefront in an interferometer. At each measurement point, a time-varying signal is produced in an interferogram. The relative phase difference between the two wavefronts at this position is encoded within these signals.

The accuracy of PMI methods lies in the ability to sample a wavefront. A wavefront can be sampled with a spacing of $\lambda/n$ where n is the number of times the system is traversed by a test beam. These methods require careful control of turbulence and vibration. A more significant limitation of these interferometric methods in the need for the reference and test beams to follow separated paths, making field use (or in-situ application) difficult. One is therefore restricted to using alternative approaches to measure, predict, approximate, or monitor lens performance and aberration during application of the optical system.

SUMMARY OF THE INVENTION

An object of this invention is to provide a convenient method for the detection of lens aberration that can be employed during the standard operation of a projection system, that is through the exposure of a photoresist coated substrate through illumination of a mask test target using a radiation source and an illumination apparatus, or by using an image detection device in a similar application. Furthermore, the method of the invention allows for the detection of specific aberration types and trends, as well as levels of aberration, though visual inspection of high resolution images of resist patterned as well as through the fitting of aberration parameters through the means of mathematical analysis of images and fitting algorithms. The test method uses a test target with at least one open figure which comprises a multiple component array of phase zones, where the multiple zones are arranged within the open figure so that their response to lens aberration is interrelated and the zones respond uniquely to specific aberrations depending on their location within the figure. This is a unique and new method of detecting a variety of aberration types including coma, spherical, astigmatism, and three-point through the exposure of a photoresist material placed in the image plane of the system and the evaluation of these images. The test method offers the advantage over other methods because of the sensitivity to particular aberration types, the unique response of multiple zones of the test target to aberrations, and the ease with which aberrations can be distinguished. An open figure of the test target refers to a figure having no single contour line to close the figure, providing no boundary line between the figure and the surrounding area.

The method of lens aberration detection is based on the identification of the deviations that occur between the images printed with the open figure test target and images that would be produced in the absence of aberration. This can be carried out for example through the use of projection imaging simulation, where simulated images can be produced without aberration and with various levels of lens aberration. Comparisons of printed resist images to simulated resist images are made while the values of the coefficients for primary Zernike aberrations are varied.

The interrelationship among the multiple phase geometry is unique to this invention and allows detection of aberration using the open figure test target that is not possible through the use of a target that consists of single closed figures, as described in U.S. Pat. No. 6,248,486. Also, the detection of aberration that is made possible through the test object of the present invention is not possible using a test object consisting of structures defined only in amplitude, as described in Chen in Pub. No. US2002/0088951.

The method of this invention is rejected in U.S. Pat. No. 6,248,486, the disclosure of which is incorporated herein by reference, and which describes a closed single figure. The method of this invention is also rejected in Pub. No. US2002/0088951 where a plurality of non-resolvable amplitude-only features is arranged as a test target and the circumstances associated with the use of phase patterns is described as problematic. It is proposed that the non-resolvable amplitude-only features are used to approximate the imaging effects of the closed single figure of U.S. Pat. No. 6,248,486. The method of the present invention is not obvious based on the disclosures of prior art. The response of the test object of the present invention to lens aberration that is interrelated where the zones respond uniquely to specific aberrations depending on their location within the figure cannot be described, predicted, or ascertained by the previous disclosures.

DETAILED DESCRIPTION OF THE INVENTION

Figure 2:
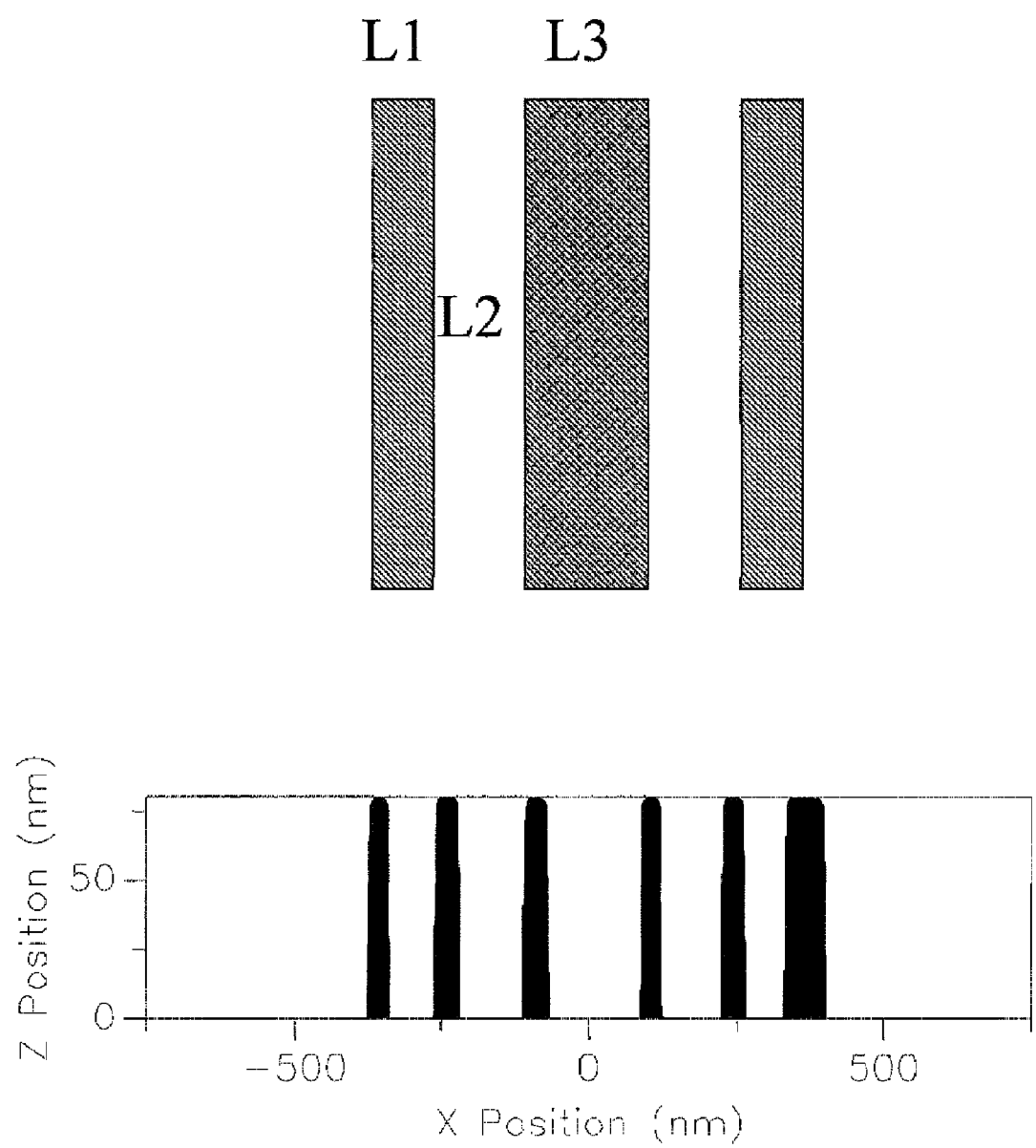
FIG. 2 is an x-oriented open multiple phase bar test object and its image in a photoresist.
Figure 3:
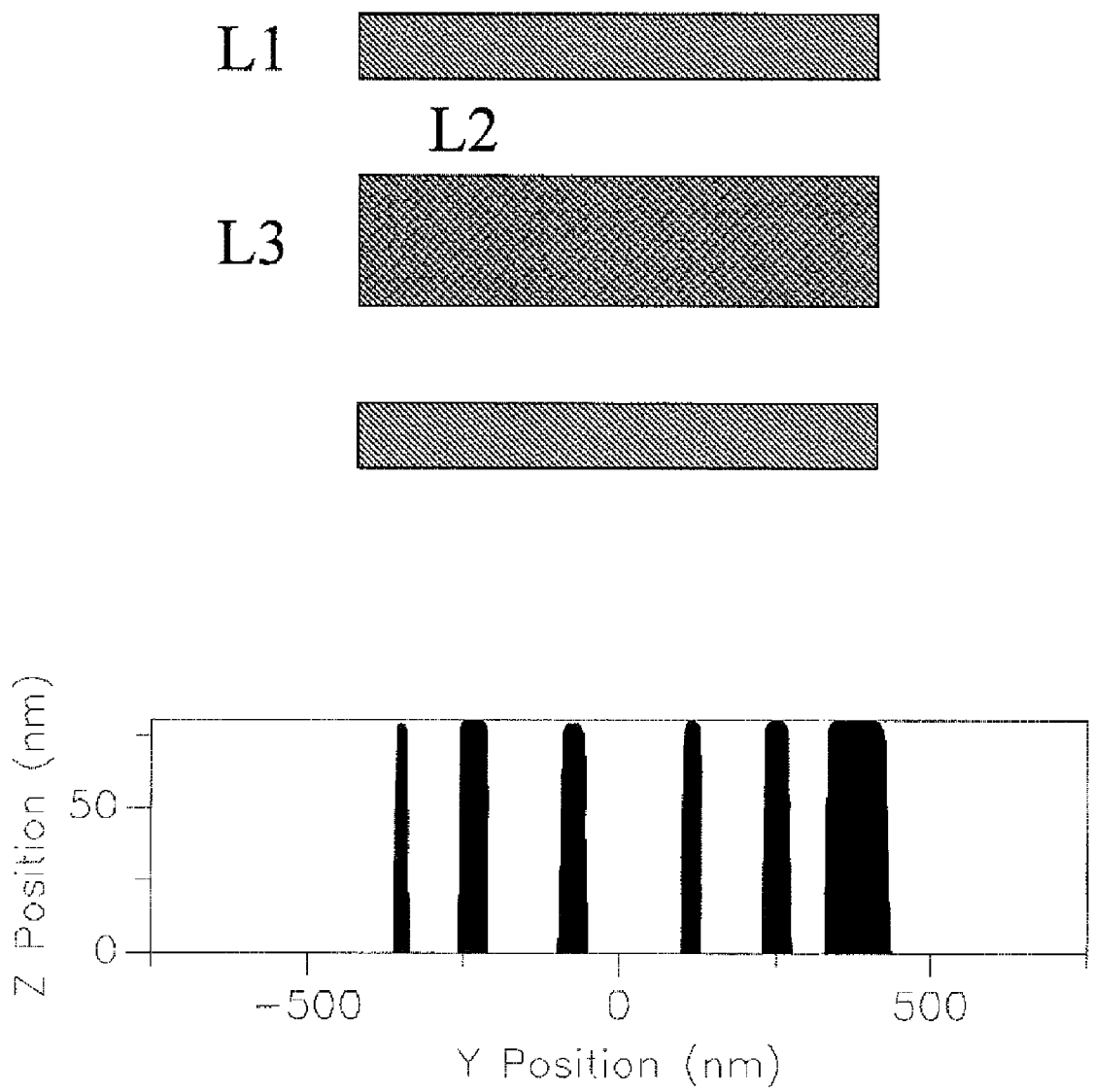
FIG. 3 is a y-oriented open multiple phase bar test object and its image in a photoresist.
Figure 4:
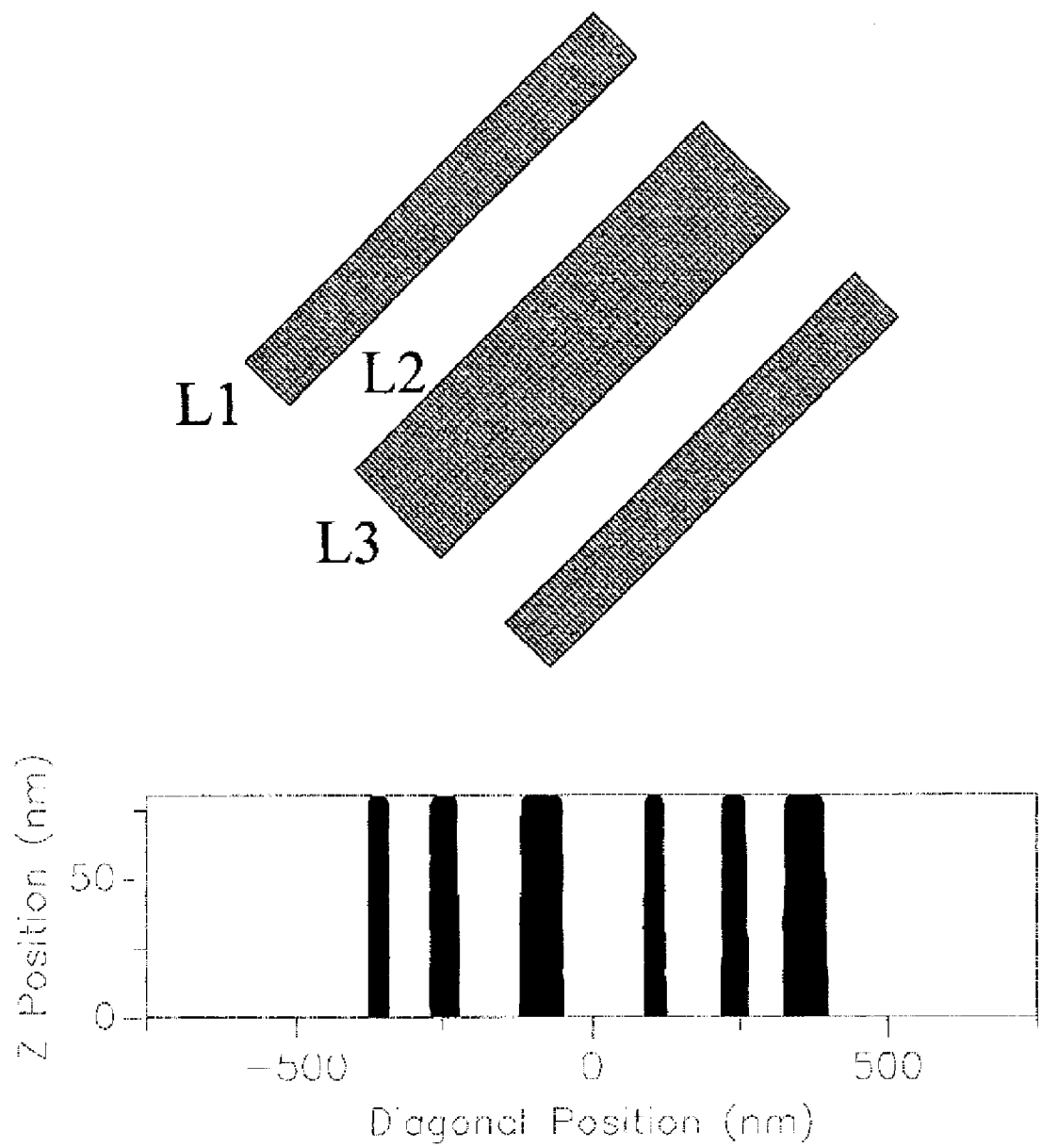
FIG. 4 is an open multiple phase bar test object oriented at 45 degrees and its image in a photoresist.
Figure 5:
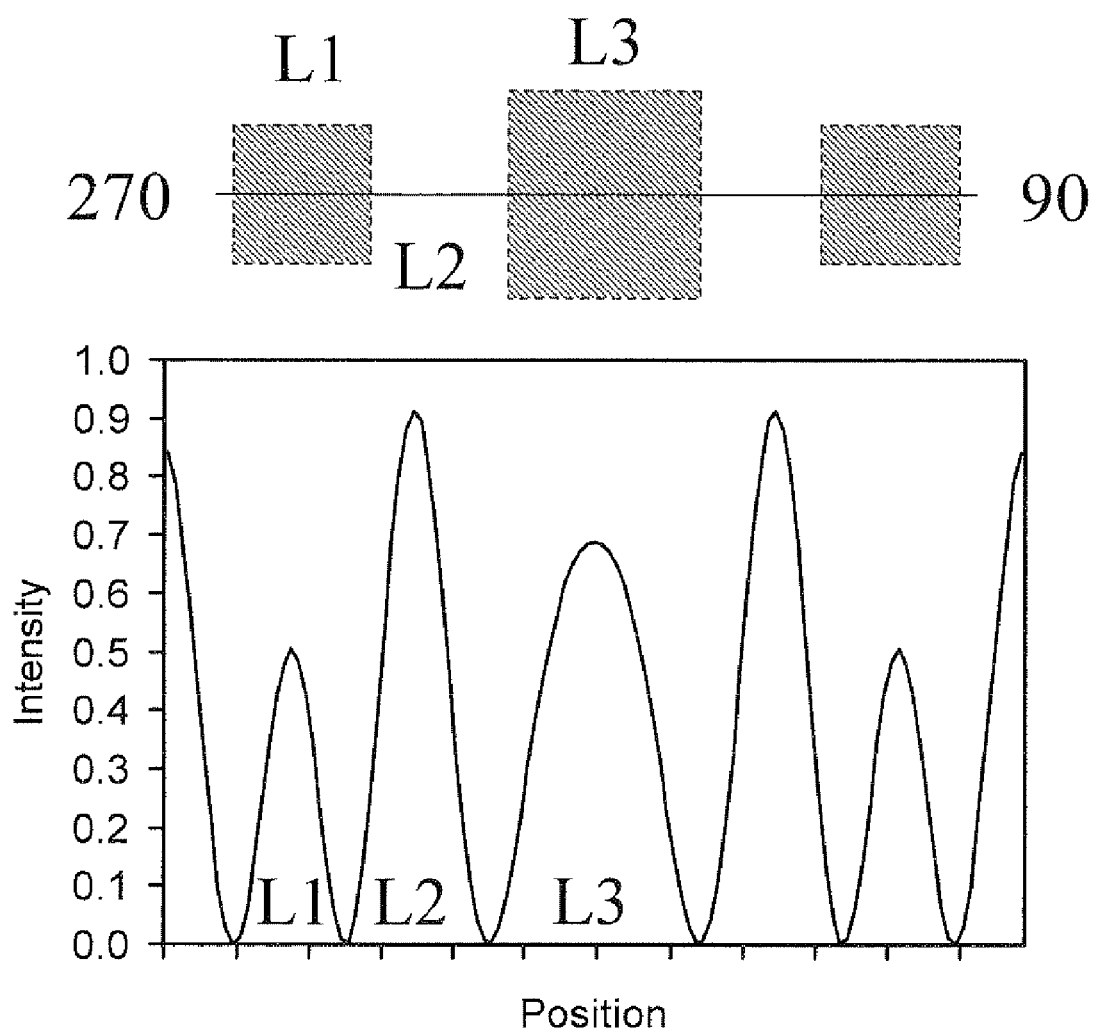
FIG. 5 is a multiple open phase box test object and its intensity image.
Figure 6:
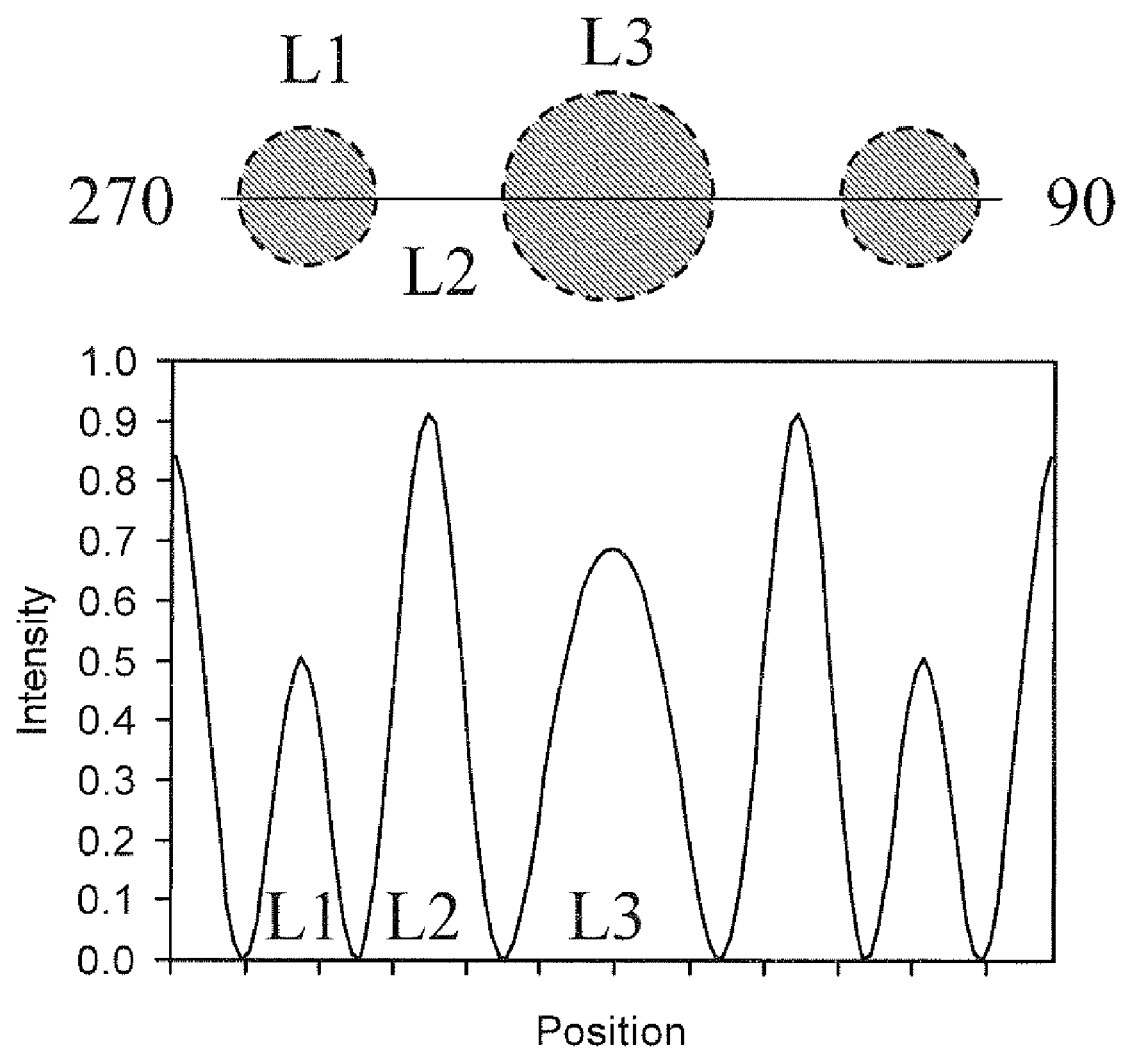
FIG. 6 is a multiple open phase circle test object and its intensity image.
Figure 7:
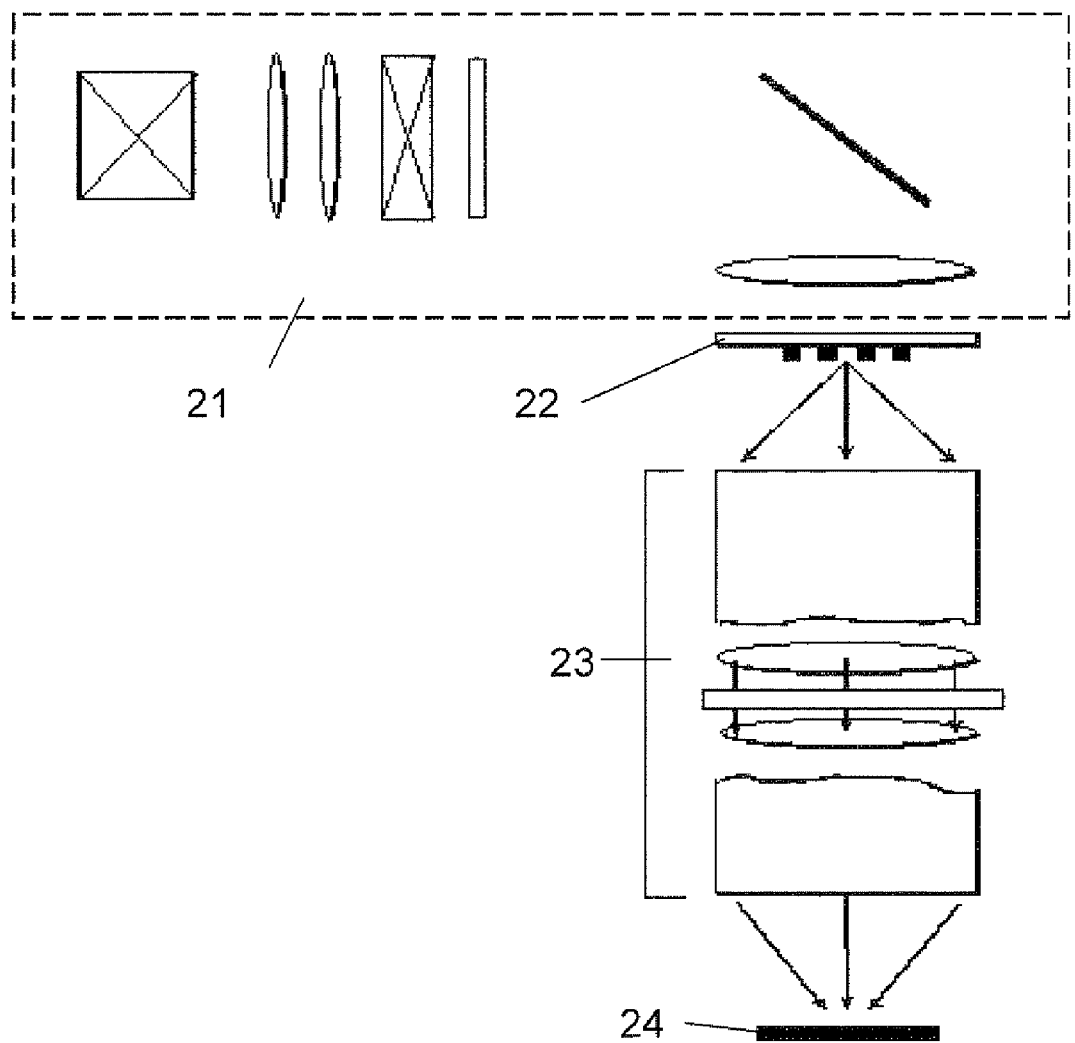
FIG. 7 is a schematic of a projection imaging system that would employ an embodiment of the method of the invention.

When imaging with a projection optical system, the aberrations in the lens pupil introduce deformation to a wavefront resulting in imaging errors. FIG. 7 shows a schematic of a projection imaging system. An illumination apparatus 21 illuminates a mask test object 22 which is imaged through an objective lens 23 onto a photosensitized substrate 24. If a test object is employed on a photomask as a phase pattern, specifically with a phase shifted from that of the surrounding area by 180 degrees, the lens aberration will introduce imaging errors characteristic of the aberration type and the mask geometry. As an example, FIG. 2 shows how three small phase lines (between 0.5 and 1.5 lambda/NA) are printed into a photoresist. The images are a result of lithographic simulation using a Prolith vector model (Prolith Version 7.0, KLA FINLE) with a wavelength of 157 nm, a numerical aperture (NA) of 0.85, a partial coherence value of 0.30, and a resist thickness of 80 nm. The resulting image consists of six separate lines, each occurring at the phase transitions on the photomask. The differences between the six lines are a result of the random aberration programmed into the simulator at a level corresponding to a root mean square (RMS) of 0.03 waves (a reasonable level for such a lithography system). FIG. 3 shows the effects of rotating the test object by 90 degrees, resulting in a different and unique effect to the resulting six lines, which is indicative of the radial and angular dependence of aberrations within the lens. FIG. 4 shows the effects of rotating the test object by 45 degrees where results are also unique. It is desirable to detect aberration effects at all orientations or directions simultaneously. The test phase objects of FIGS. 2 through 4 can be reduced from multiple line groupings to multiple phase box groupings, as shown in FIG. 5. This figure shows how the image intensity through the center the three boxes of sizes L1 and L3 spaced distance L2 apart and oriented along a 90-270 degree axis results in six dark regions, or lines, in a clear field, similar the effect for the three bar patterns in earlier figures. The separation of the three dark regions is determined by the L1, L2, and L3 dimensions. Furthermore, the shape of the phase features within the test target need not be square. FIG. 6 shows how circular phase shapes produce similar intensity profiles along a central region of a multiple pattern grouping.

Figure 1:
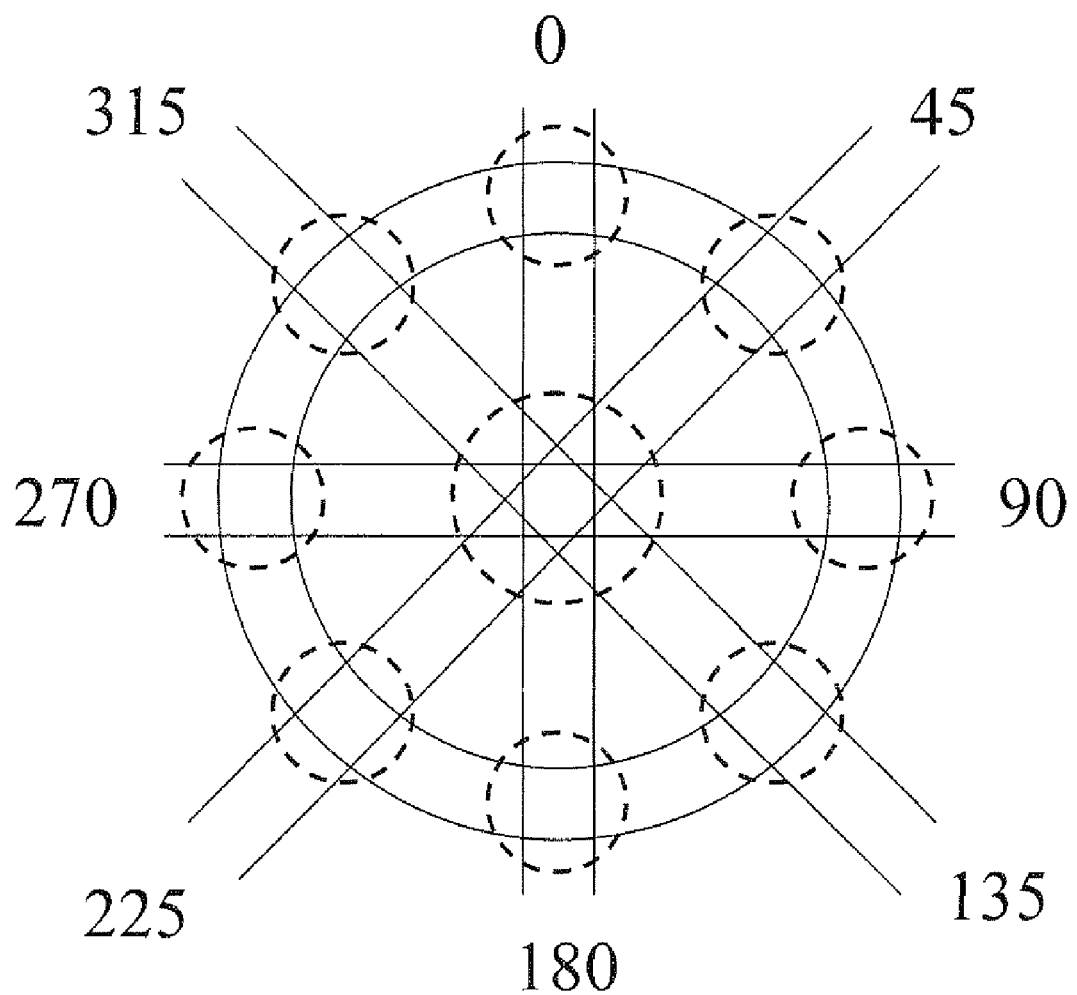
FIG. 1 is a open phase test target with pairs of phase zones oriented at 0, 45, 90, and 180 degrees.

A preferred embodiment of the invention is shown in FIG. 1. In this embodiment, a test target is designed as a grouping of phase zones so that the test target is a single open figure based on this collection of zones. The test target is referred to as a Wheel Aberration Target. The phase of the zones are shifted with respect to the phase of the surrounding field by 180 degrees. The features are sized in ranges between 0.5 and 1.5 lambda/NA and the entire open phase test target is between 2.5 and 5 lambda/NA in size. The interrelationships between the geometry is unique for each region within the test target as each portion has a unique proximity to surrounding phase values. These unique proximity conditions for regions in the target of FIG. 1 are described below.

| Region of target | Feature size | Neighborhood |
|---|---|---|
| Center | L3 | Features sized L1 spaced L2 at 0, 45, 90, 135, 180, 225, 270, and 315 degrees |
| Top | L2 | Feature sized L3 spaced L2 below Feature sized L2 at 315 and 45 degrees |
| Bottom | L2 | Feature sized L3 spaced L2 above Feature sized L2 at 225 and 135 degrees |
| Right | L2 | Feature sized L3 spaced L2 to left Feature sized L2 at 45 and 135 degrees |
| Left | L2 | Feature sized L3 spaced L2 to right Feature sized L2 at 315 and 225 degrees |
| Top-Right | L2 | Feature sized L3 spaced L2 below-left Feature sized L2 at 0 and 90 degrees |
| Top-Left | L2 | Feature sized L3 spaced L2 below-right Feature sized L2 at 0 and 270 degrees |
| Bottom-Right | L2 | Feature sized L3 spaced L2 above-left Feature sized L2 at 180 and 90 degrees |
| Bottom-Left | L2 | Feature sized L3 spaced L2 above-right Feature sized L2 at 180 and 270 degrees |

Figure 8:
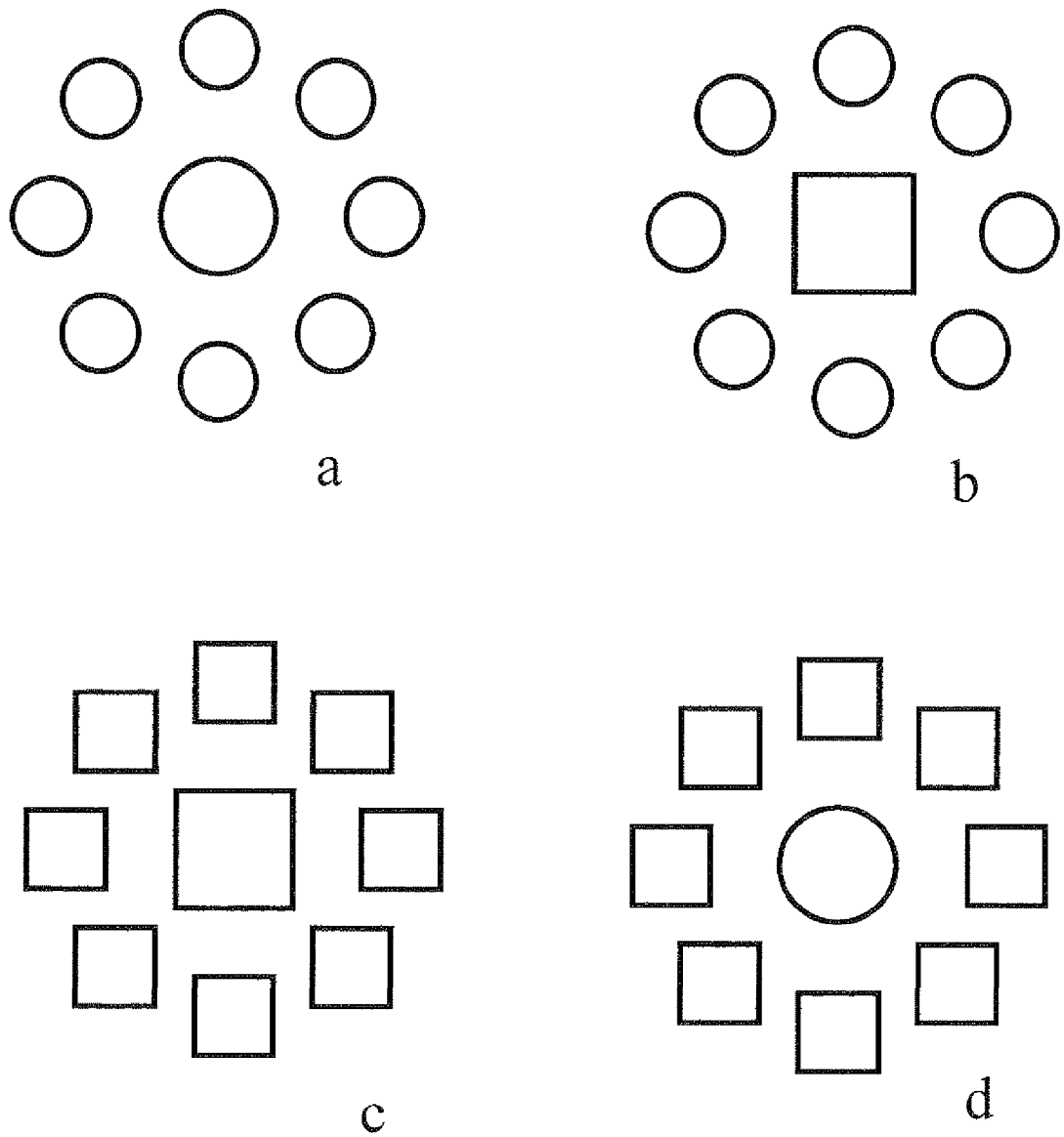
FIG. 8 shows variations of open phase test targets using circular and square shaped components.

These multiple zones of the test object form a single figure with no closed form. This open phase nature of the test target is a unique and significant benefit of the invention. Unlike a closed figure having a phase structure that is designed so that all regions around the structure are identical regardless of azimuthal position, each location of the multiple feature open phase target of the invention is unique. Furthermore, the test structure of the present invention can take on forms different than that shown in FIG. 1. Examples of test targets with nine phase features are shown in FIG. 8. These targets consist of groupings of square and circular phase features of various sizing and shaping. The shape of the features within the target is less critical than the sizing and spacing since the detailed structure of the features is likely beyond the resolution of the lithography system. The transmission of the zones can be varied. In one embodiment, the transmission of all zones and all surrounding regions is unity. In another embodiment of the invention, the center zone has a transmission of zero. In each circumstance, the response of the zones within the test object to lens aberration are interrelated and the zones respond uniquely to specific aberrations depending on their location within the figure. Also, the grouping of the features is not limited to this descriptive example. Variations in the number of features, shaping, sizing, phase, transmission, and density can be modified with the same open phase test target effect where the interrelationship among the phase features allows for the unique detection of aberrations.

Figure 9:
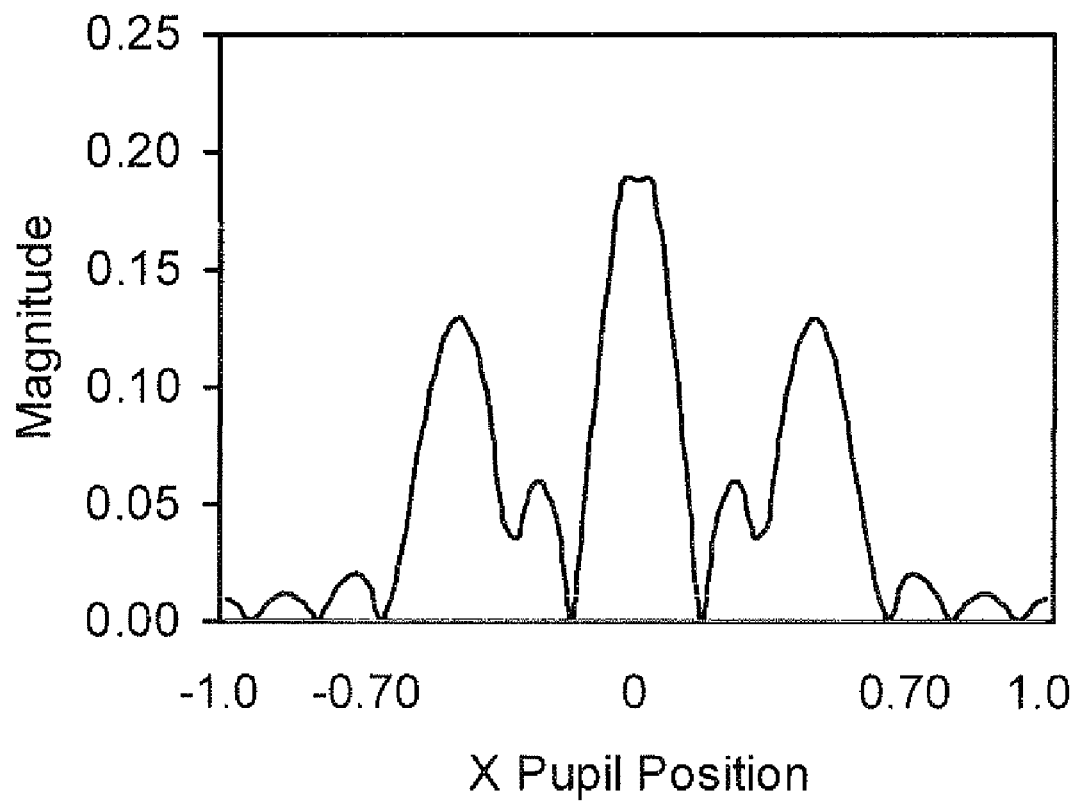
FIG. 9 is a plot of the diffraction energy within an objective lens pupil for a test target having L1=200 nm, L2=200 nm, and L3=200 nm.
Figure 10:
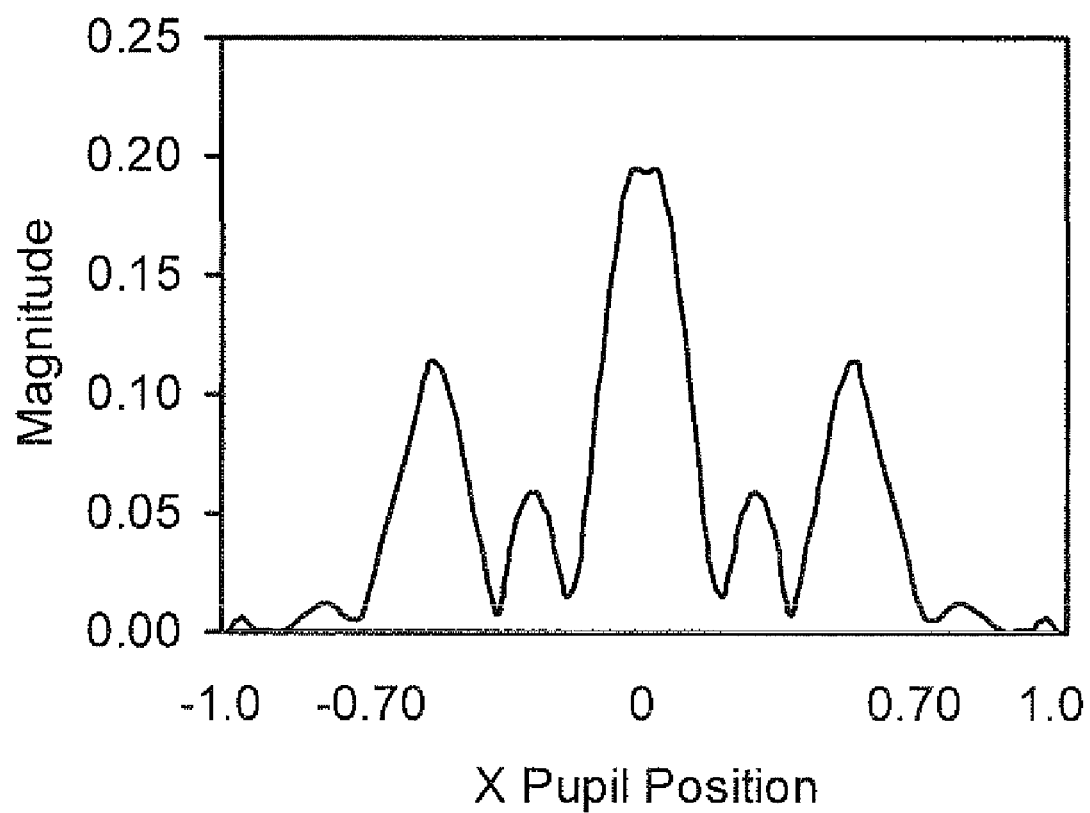
FIG. 10 is a plot of the diffraction energy within an objective lens pupil for a test target having L1=200 nm, L2=150 nm, and L3=200 nm.
Figure 11:
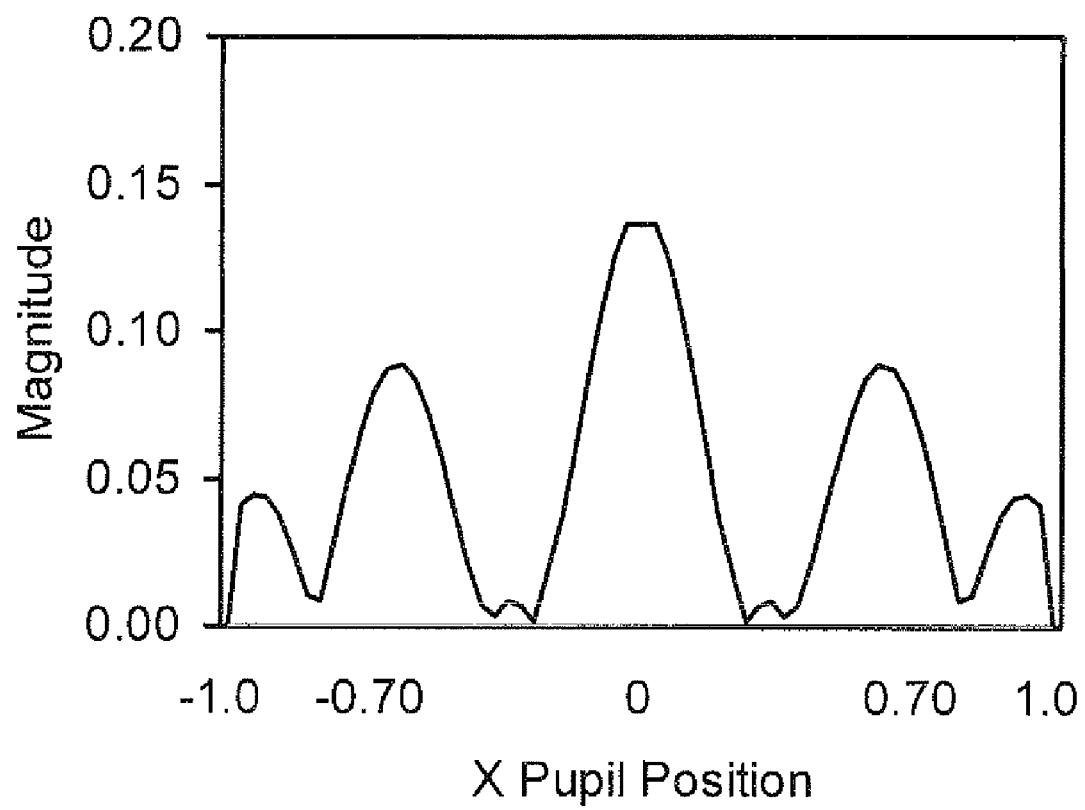
FIG. 11 is a plot of the diffraction energy within an objective lens pupil for a test target having L1=200 nm, L2=150 nm, and L3=100 nm.
Figure 12:
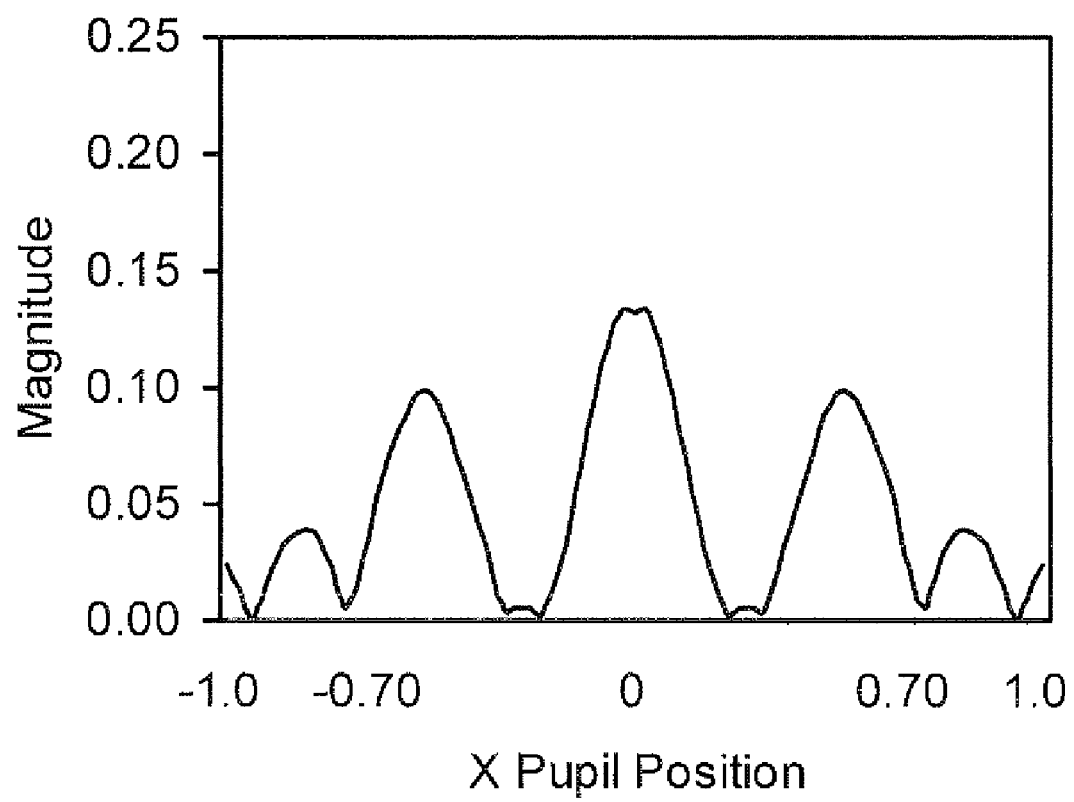
FIG. 12 is a plot of the diffraction energy within an objective lens pupil for a test target having L1=200 nm, L2=200 nm, and L3=100 nm.

Aberrations influence imaging through the deformation that they produce in a wavefront within a lens pupil. Consequently, it is desirable to design an aberration test target so that it will sample a lens pupil in the most beneficial fashion. Since aberrations have unique character in the manner which they influence specific portions of a lens pupil, the test target of the present invention can be designed so that it is most sensitive to particular aberration types and order. As an example, FIG. 9 shows the magnitude of the diffraction energy within the objective lens pupil for a test object comprising zones with sizing values corresponding to L3=200 nm, L2=200 nm, and L1=200 nm for a 157 nm wavelength imaging system operating at a numerical aperture of 0.85. FIG. 10 shows the magnitude of the diffraction in the objective lens pupil for a test object comprising zones with sizing values corresponding to L3=200 nm, L2=150 nm, and L1=200 nm for a 157 nm wavelength imaging system operating at a numerical aperture of 0.85. FIG. 11 shows the magnitude of the diffraction in the objective lens pupil for a test object comprising zones with sizing values corresponding to L3=200 nm, L2=150 nm, and L1=100 nm for a 157 nm wavelength imaging system operating at a numerical aperture of 0.85. FIG. 12 shows the magnitude of the diffraction in the objective lens pupil for a test object comprising zones with sizing values corresponding to L3=200 nm, L2=200 nm, and L1=100 nm for a 157 nm wavelength imaging system operating at a numerical aperture of 0.85. The distribution of the diffraction energy within a lens pupil is unique for each example and shows how a test object can be designed for particular sensitivity to an aberration order. The diffraction energy distribution of FIG. 11 for example is most sensitive to $3^{rd}$ order (or primary) aberration and the sizing values of this example are used for the remaining examples of the present description.

FIGS. 13 through 21 show simulated resist images from a test object with one open figure which comprises a multiple component array of phase zones, where sizing dimensions correspond to L3=200 nm, L2=150 nm, and L1=100 nm for a wavelength of 157 nm and a numerical aperture of 0.85. The zones within the figure are circular. The phase of the circular regions are phase shifted from the surrounding region by 180 degrees. The transmission of the figure is unity.

Figure 13:
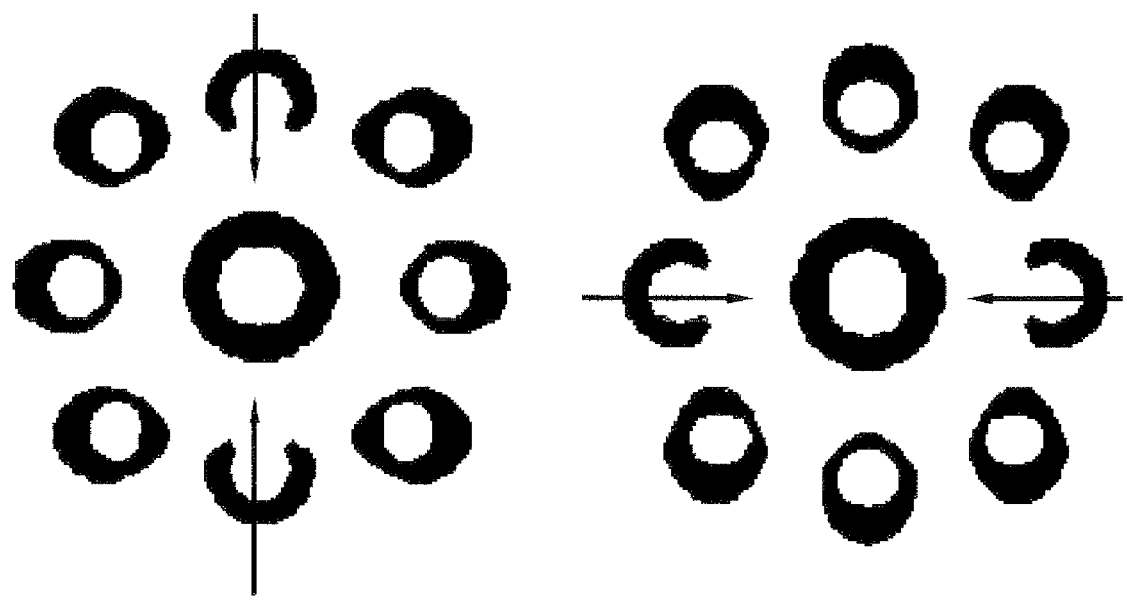
FIG. 13 is a resist image of an open phase test target showing the effects of negative astigmatism.

FIG. 13 shows the unique impact of negative $3^{rd}$ order astigmatism through a defocus range of +/−0.12 microns. The unique behavior of the images resulting from the method of the invention is the characteristic deformation of the images printed from the zones within the test target at X and Y orientations. In the presence of negative astigmatism, positive defocus causes the opening of the zones at the extreme Y locations. In the presence of negative astigmatism, negative defocus causes the opening of the zones at the extreme X locations.

Figure 14:
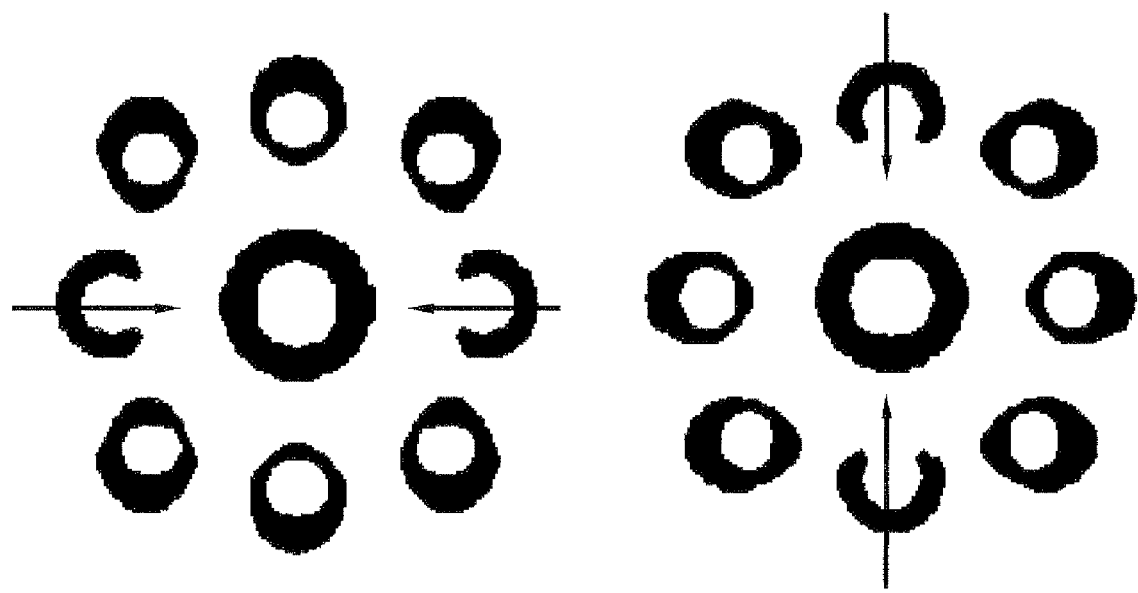
FIG. 14 is a resist image of an open phase test target showing the effects of positive astigmatism.

FIG. 14 shows the unique impact of positive $3^{rd}$ order astigmatism through a defocus range of +/−0.12 microns. The unique behavior of the images resulting from the method of the invention is the characteristic deformation of the images printed from the zones within the test target at X and Y orientations. In the presence of positive astigmatism, positive defocus causes the opening of the zones at the extreme X locations. In the presence of positive astigmatism, negative defocus causes the opening of the zones at the extreme Y locations.

Figure 15:
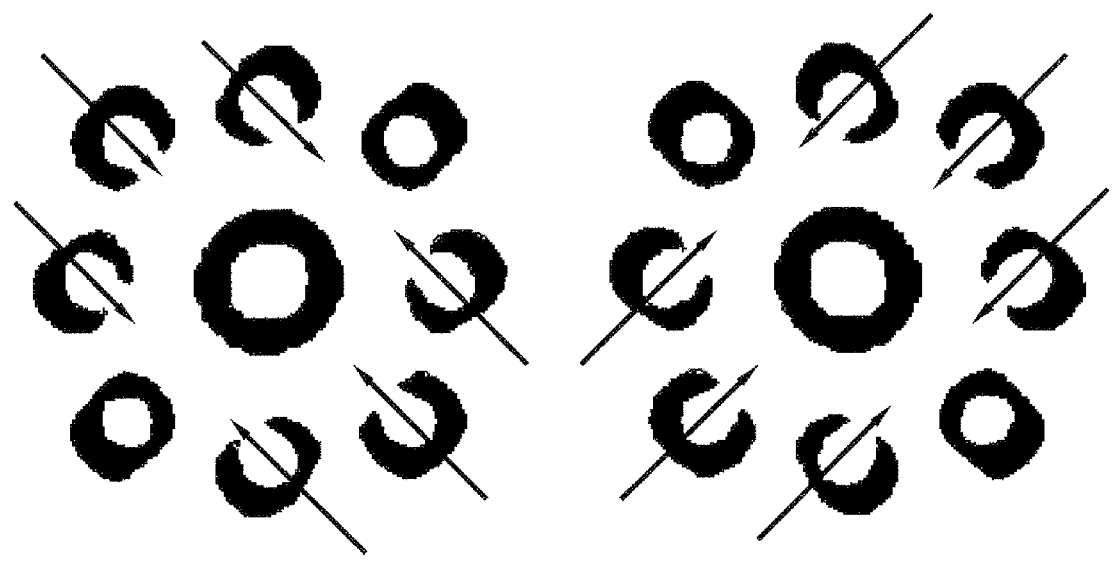
FIG. 15 is a resist image of an open phase test target showing the effects of positive 45 degree astigmatism.

FIG. 15 shows the unique impact of positive $3^{rd}$ order 45 degree astigmatism through a defocus range of +/−0.12 microns. The unique behavior of the images resulting from the method of the invention is the characteristic deformation of the images printed from the zones within the test target at diagonal orientations. In the presence of positive 45 degree astigmatism, positive defocus causes the opening of the zones at the extreme −45 degree locations. Negative defocus causes the opening of the zones at the extreme +45 degree locations.

Figure 16:
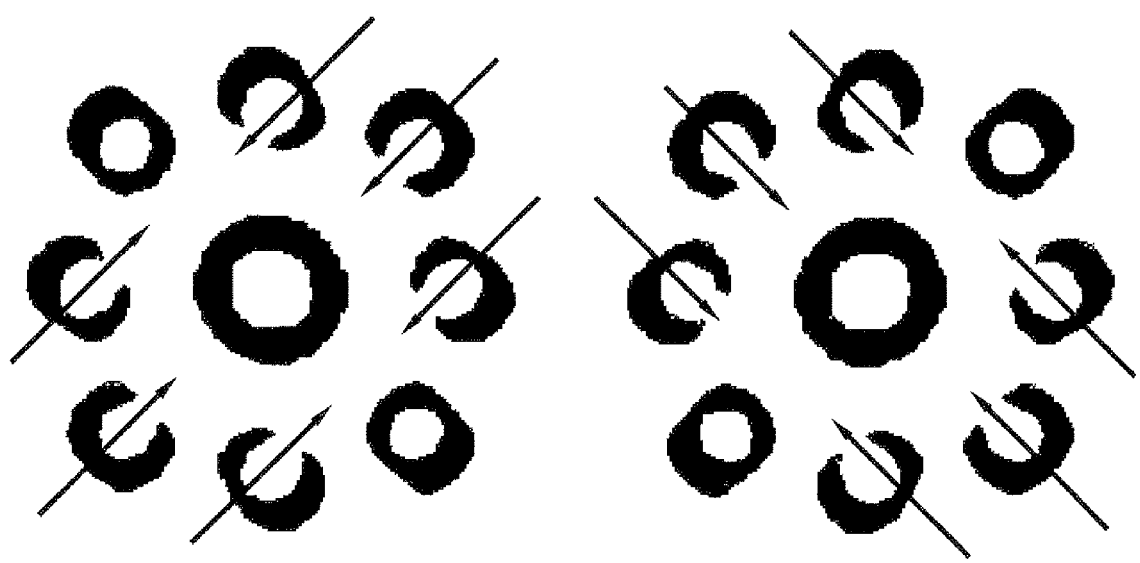
FIG. 16 is a resist image of an open phase test target showing the effects of negative 45 degree astigmatism.

FIG. 16 shows the unique impact of negative $3^{rd}$ order 45 degree astigmatism through a defocus range of +/−0.12 microns. The unique behavior of the images resulting from the method of the invention is the characteristic deformation of the images printed from the zones within the test target at diagonal orientations. In the presence of negative 45 degree astigmatism, positive defocus causes the opening of the zones at the extreme +45 degree locations. Negative defocus causes the opening of the zones at the extreme −45 degree locations.

Figure 17:
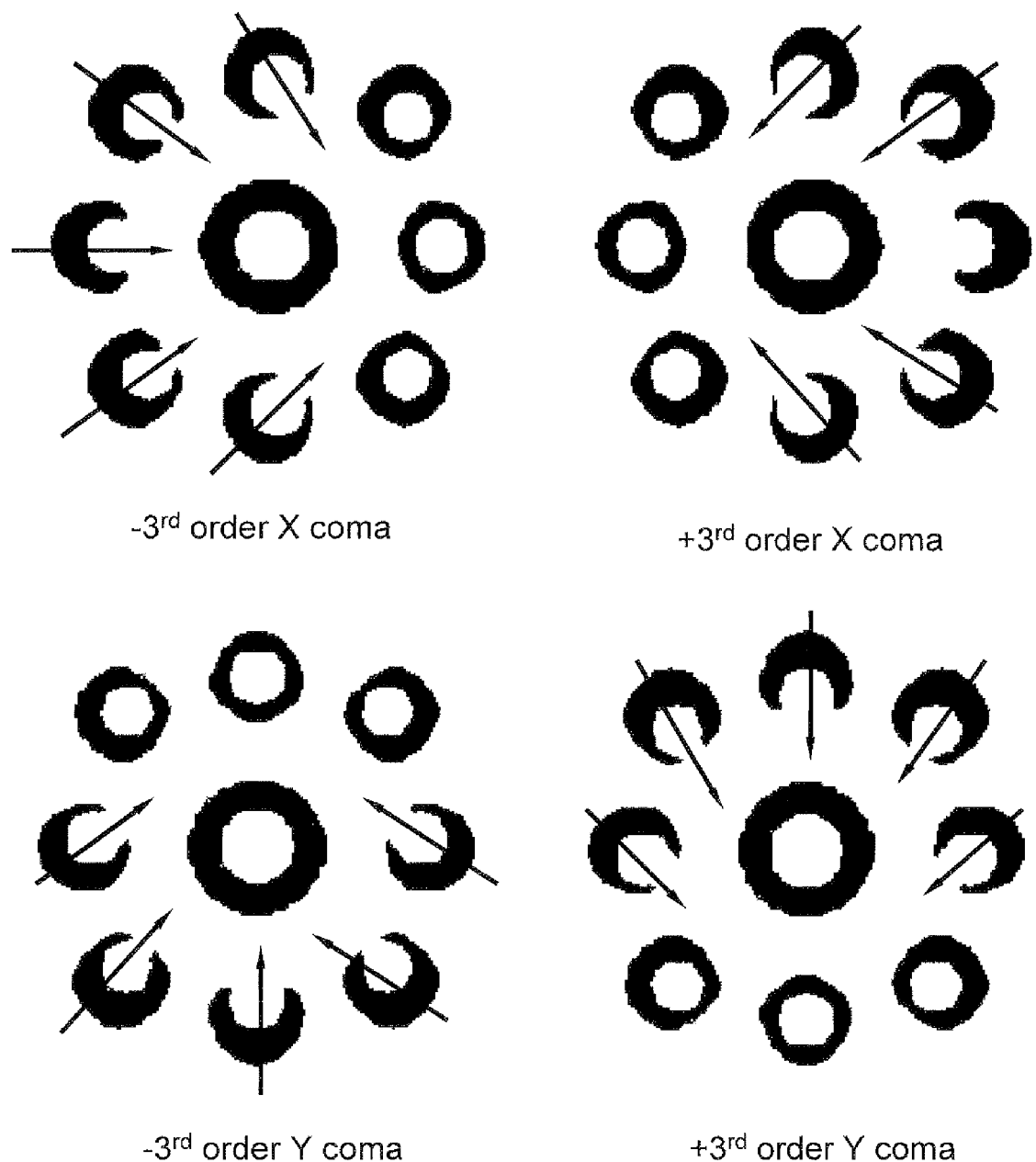
FIG. 17 is a resist image of an open phase test target showing the effects of coma.

FIG. 17 shows the unique impact of $3^{rd}$ order coma. The unique behavior of the images resulting from the method of the invention is the characteristic deformation of the images printed from the zones within the test target at all orientations. Coma aberration leads to the characteristic deformation of the images printed from the zones within the test target so that the zones are opened and oriented toward a point corresponding to the coma aberration. The outermost zone along the direction of the coma aberration, and opposite in sign, remains closed. Vectors can be drawn from the openings within the zones, which directed opposite in sign along the direction of the coma aberration, converging to a point at the edge of the target.

Figure 18:
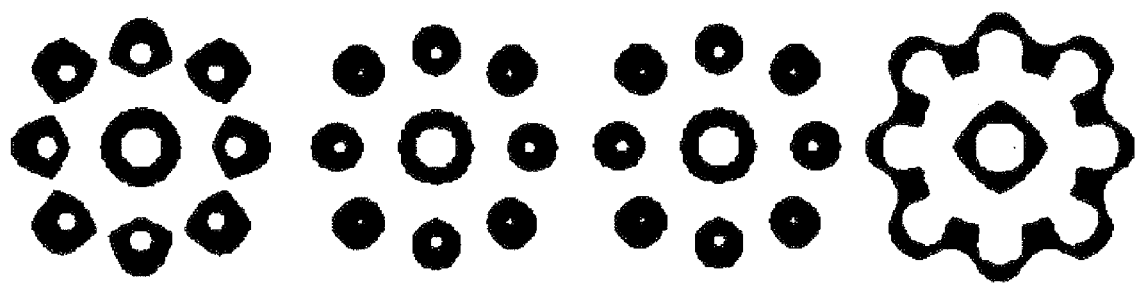
FIG. 18 is a resist image of an open phase test target showing the effects of spherical.
Figure 18:
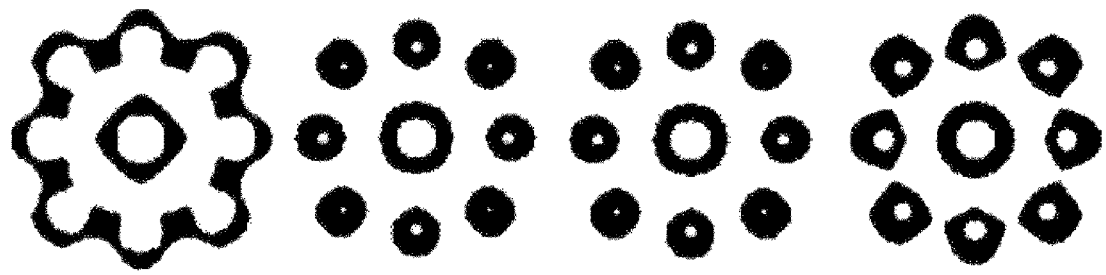

FIG. 18 shows the unique impact of spherical aberration. Spherical aberration causes a distinct expansion and contraction of the zones within the target. The effects are symmetrical within the target, which is an indication of the symmetrical nature of spherical aberration. The figure shows the effect of defocus values of −0.16, 0.12, +0.12, and +0.16 microns of defocus for negative and positive aberration.

Figure 19:
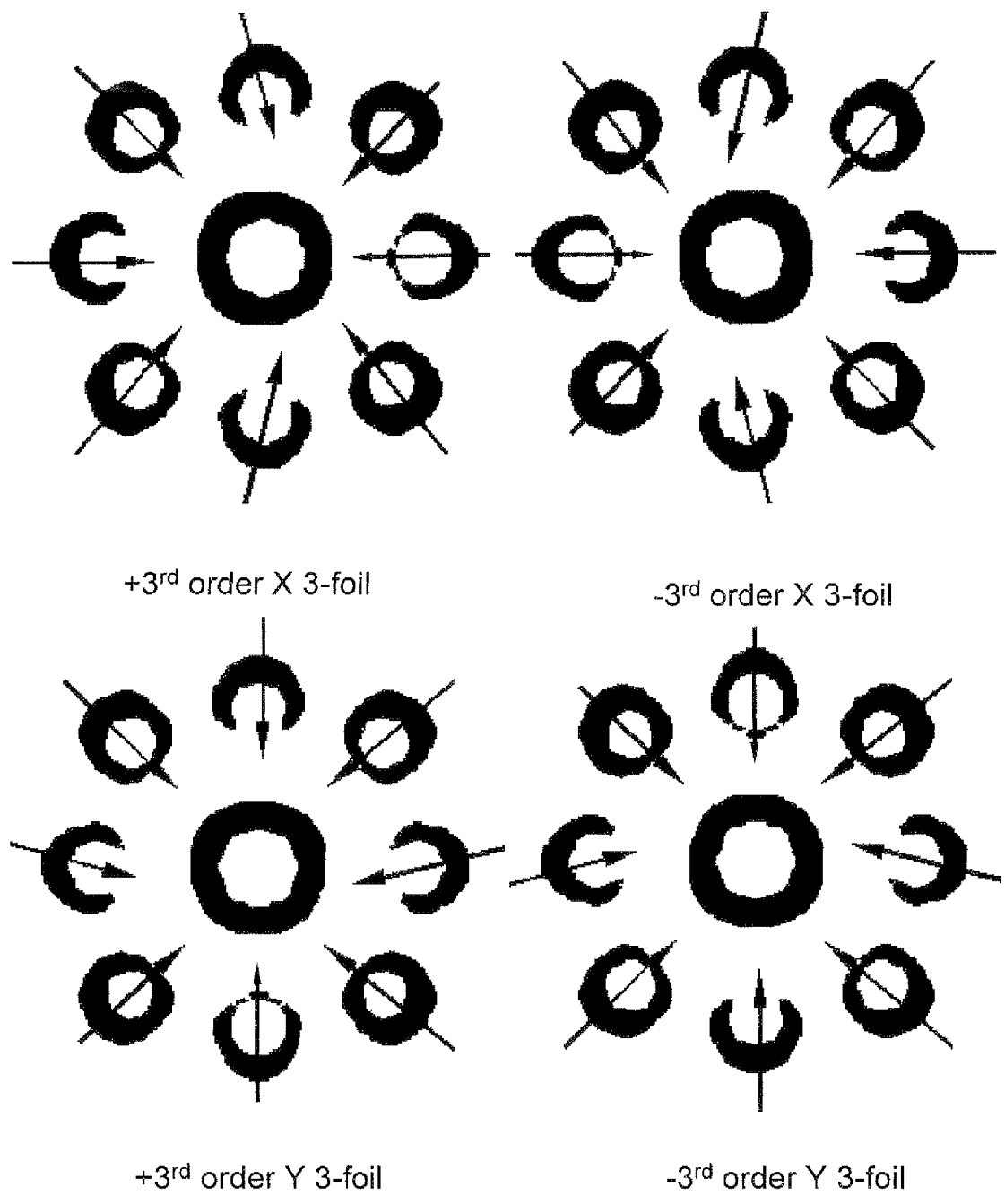
FIG. 19 is a resist image of an open phase test target showing the effects of three-foil.

FIG. 19 shows the unique impact of $3^{rd}$ rd order 3-point aberration. The unique behavior of the images resulting from the method of the invention is the characteristic deformation of the images printed from the zones within the test target at all orientations. 3-point aberration leads to the characteristic deformation of the images printed from the zones within the test target so that the zones are opened and oriented toward a point corresponding unique to the 3-point aberration. Vectors can be drawn from the openings within the zones, which directed opposite in sign along the direction of the 3-point aberration, converging to a point within the target. Unlike the coma aberration effects, the influence of 3-point is a deformation of all zones and a convergence of vectors corresponding to a 120 degree symmetry of the aberration.

Figure 20:
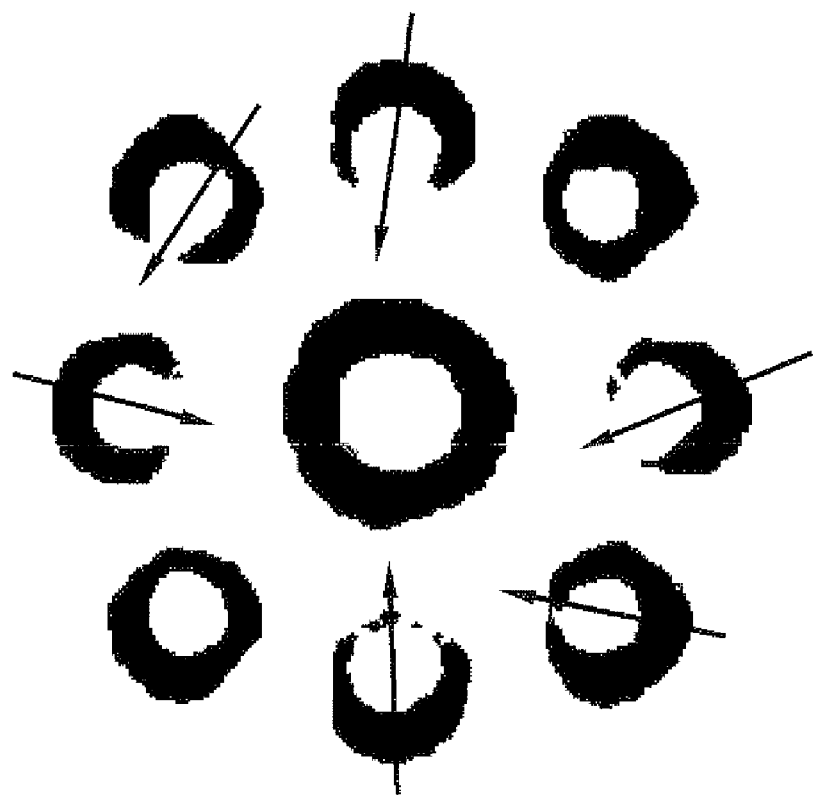
FIG. 20 is a resist image of an open phase test target showing the effects of multiple aberrations resulting in a total wavefront OPD of 0.035 waves RMS with 0.10 microns of defocus.

FIG. 20 is a simulated resist image of an open phase test target showing the effects of multiple aberrations. The effects of coma, astigmatism, spherical, and 3-point aberration combine to produce combined deformation effects on the zones of the test target. The total wavefront aberration in this example is 0.03 waves (RMS). The contribution from primary aberrations is: −0.0025 waves of astigmatism, 0.0091 waves of 45 degree astigmatism, −0.0093 waves of x-coma, 0.0227 waves of y-coma, −0.0207 waves of spherical, −0.0676 waves of 3-point, and 0.0422 waves of 45 degree 3-point.

Figure 21:
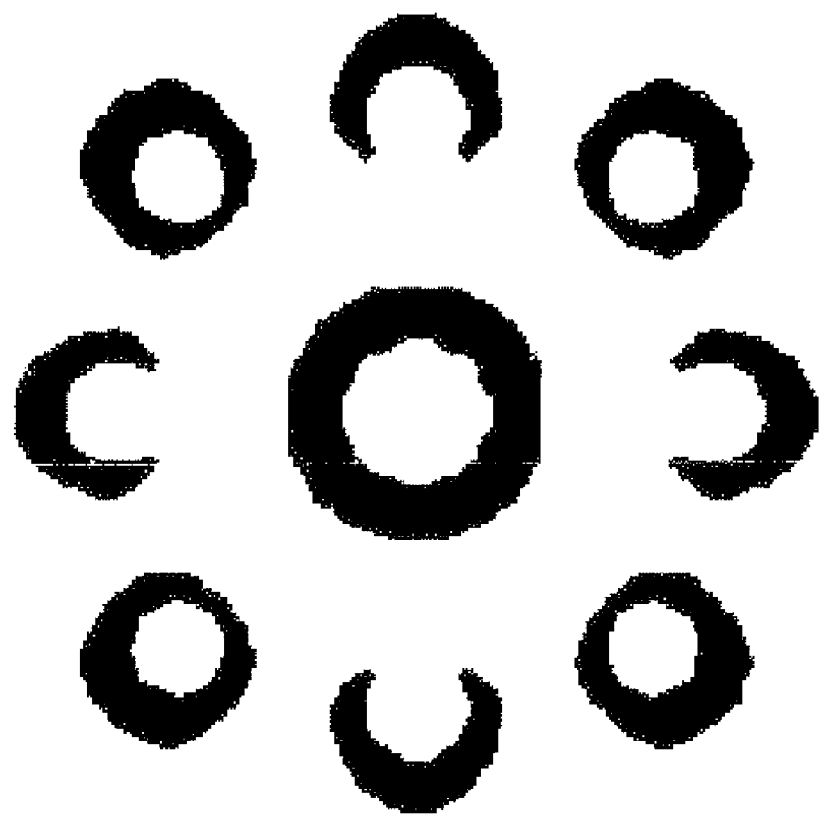
FIG. 21 is a resist image of an open phase test target showing the effects of no aberration.

FIG. 21 is a simulated resist image of an open phase test target showing the effects of no aberration. The zones within the test target open to a central region of the target.

Figure 22:
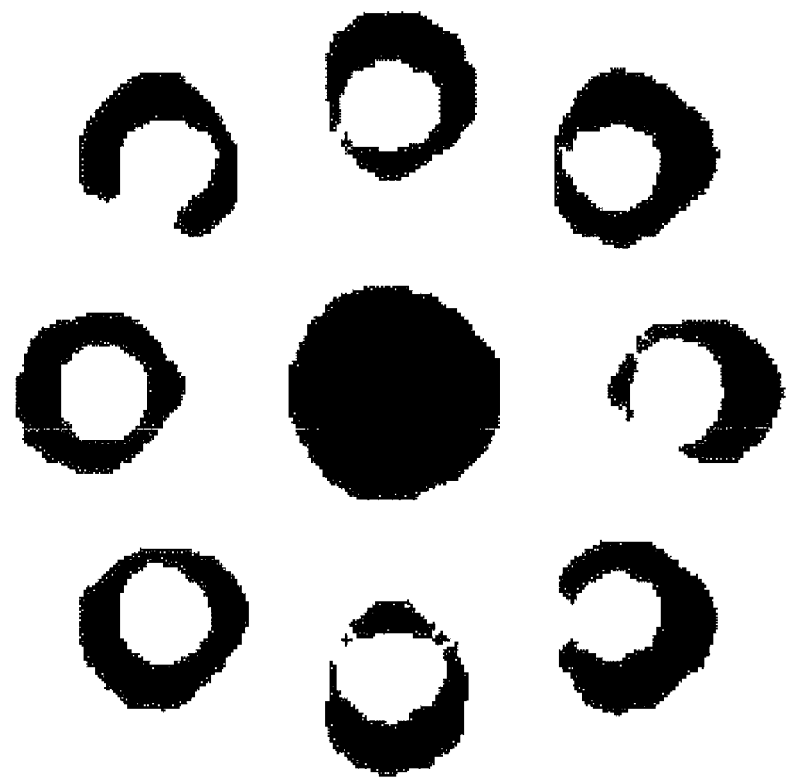
FIG. 22 is a resist image of a test target which has a central zone intensity of zero.

FIG. 22 is a resist image of a test target which has a central zone intensity of zero showing the effects of the multiple aberrations. The effects of coma, astigmatism, spherical, and 3-point aberration combine to produce combined deformation effects on the zones of the test target similar to the previous examples where the central zone intensity is unity.

The test object of the present invention is achieved as a target which is fabricated using methods that are common to phase-shift photomask fabrication. The steps involved in the fabrication of the target include the layout of the test object using computer aided design of other methods, exposing a sensitized polymer film coated over a quartz plate which may also have a masking film, developing the exposed image, and transferring the image using a dry or wet pattern transfer process. The phase shift within the regions of the test object are created through the etching of the quartz substrate to a depth corresponding to 180 degrees, with possible depth correction incorporated to account for phase effects of the relief structure. Alternative methods can be employed with the same effect, including the deposition of layers to achieve phase definition. Transmission of the test object can be controlled through patterning of the masking layer.

It should be particularly noted that the reference (substantially aberration free) image is produced or created through lithographic modeling and simulation. Aberrations are added to the simulation to allow for fitting by comparison of the simulated result to the result imaged via lithography. An iterative process is carried out where convergence to the lens aberration is achieved by comparison of the simulated result to the lithographic result. Alternatively, other methods of fitting the simulated result to the lithographic result can be used, such as, for example, mathematical fitting of shape parameters to the imaged target by polynomial fitting of curved edges, fitting parameters to target openings, fitting parameters to sizing and/or shifting results, to converge on an aberration level that would have resulted in such pattern deformation.

It should also be particularly noted that the analysis of the lithographic test image is performed by using a magnifying device. More particularly, the device is preferably scanned by a scanning detection device, such as, for example, a scanning electron microscope. The scanning detection device preferably coverts the scanned image into image data, which is then processed and displayed in a meaningful way, such as, for example, in graphs or diagrams, or is used to display actual visual images of the observed structures on a display device, such as a monitor.

Figure 23:
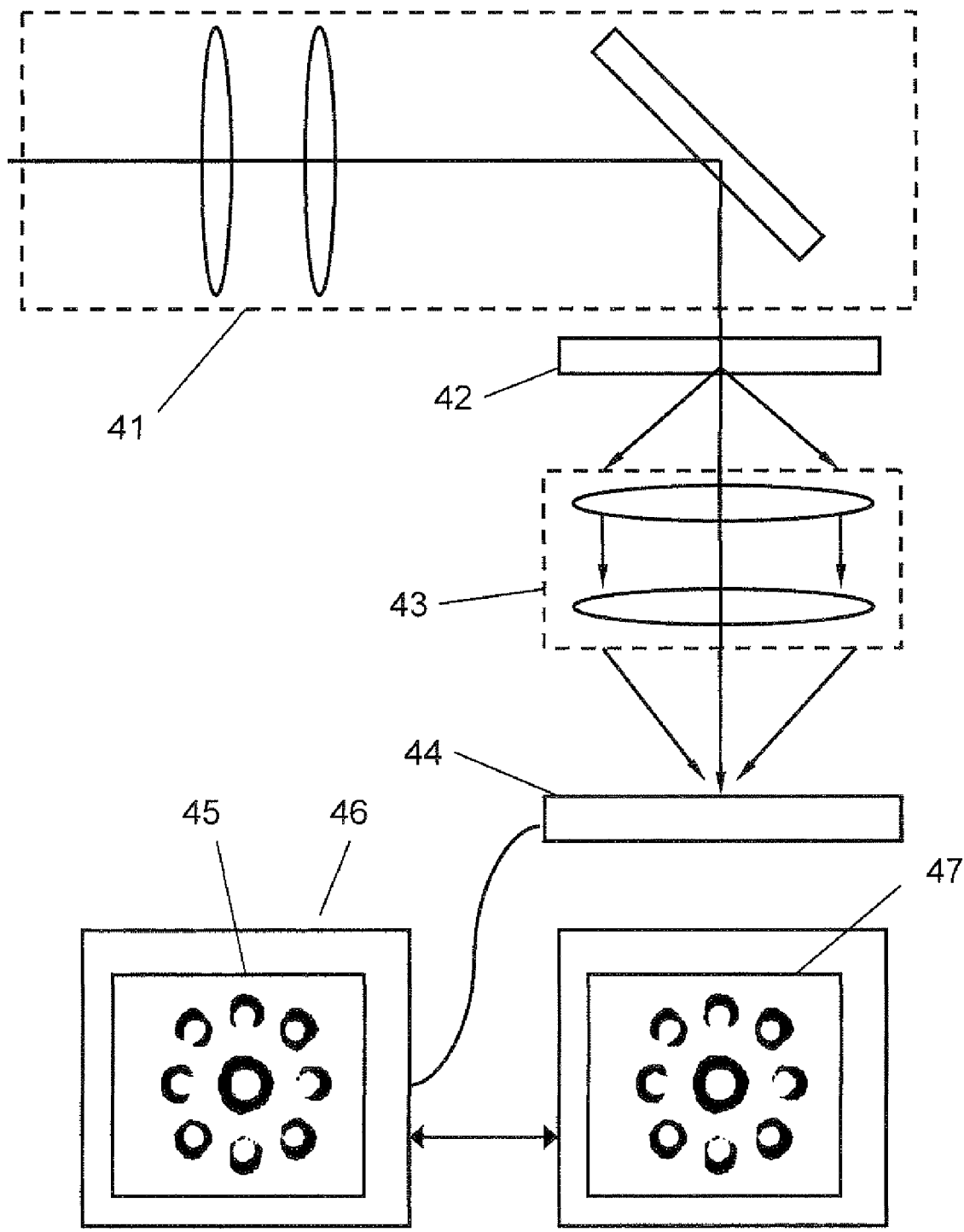
FIG. 23 is a schematic of a projection imaging system that would employ another embodiment of the method of the invention.

An additional embodiment of the invention is the for the application to micro-optical projection imaging systems, such as mask inspection systems, wafer inspection systems, and aerial image measurement systems (AIMS). AIMS are used to optically emulate the aerial image generated in projection lithography systems for evaluating reticles under specific stepper or scanner settings of numerical aperture (NA), partial coherence of illumination or pupil filling, wavelength and illumination type. The projection optics employed in such micro-optical inspection and measurement systems relay an image of high resolution objects onto an image detection device. Such devices include CCDs (charge coupled devices), CIDs (charge injection devices), photodiode arrays, and other electric, electronic, or solid state detectors for image capture. FIG. 23 shows such a system where an illumination sub-assembly 41 illuminates a test object 42 which is imaged through a projection lens sub-assembly 43 onto an image detection device 44. The image detection device 44 produces an image 45 which is captured and displayed onto a display screen 46. The captured image 45 is digitally compared using a computer to a reference image 47 which is produced or created using computer based modelling and simulation. The method of aberration detection and measurement carried out for application to micro-projection inspection systems includes a test target with at least one open figure including a multiple component array of phase zones, placing the test target in an object plane of the inspection system, producing an image through the inspection system onto an image detector, and comparing the detected image to a reference image without aberrations to detect aberrations in the optical system. Aberrations are added to the reference image model to allow for fitting by comparison to the captured result. An iterative process is carried out where convergence to the lens aberration is achieved by comparison of the simulated result to the lithographic result. A solution is converged upon as the differences between the captured image and the reference image are minimized. The amount of aberration that is added to the model which generates the reference image indicates the types and levels of aberration present. Alternatively, other methods of fitting the simulated result to the lithographic result can be used, such as, for example, mathematical fitting of shape parameters to the imaged target by polynomial fitting of curved edges, fitting parameters to target openings, fitting parameters to sizing and/or shifting results, to converge on an aberration level that would have resulted in such pattern deformation.

Figure 24:
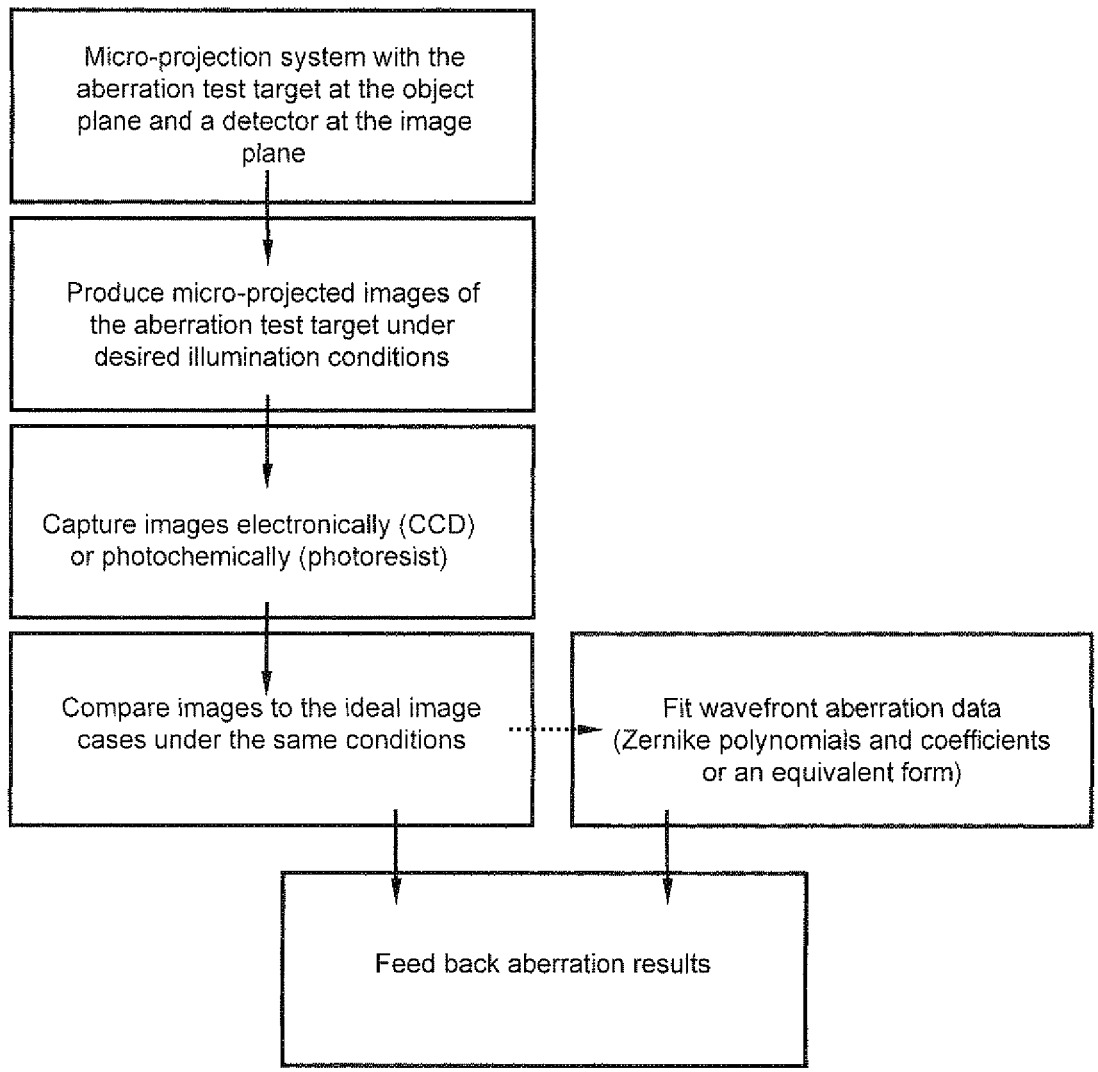
FIG. 24 is a schematic showing the detection and measurement of aberrations in micro-optical inspection and measurement systems.

FIG. 24 is a schematic of the process sequence for the application of the invention to micro-optical inspection and measurement systems. The steps include using a micro-projection system with the aberration test target at the object plane and a detector at the image plane; the production of micro-projected images of the aberration test target under desired illumination conditions; the capture of images electronically using a CCD, another electronic device or a photoresist; the comparison of images to the ideal image cases under the same conditions; the fitting of wavefront aberration data (Zernike polynomials and coefficients or an equivalent form); and the feed back aberration results. The feedback step can allow for an adjustment in the optical imaging system if necessary. Alternatively, it may be used to qualify the capability of the optical imaging system.

The present invention is a method to detect and measure aberrations in an optical system using a test target in the object plane of a projection system and imaging a photoresist film with the system. The invention is described above but it is to be understood that it is not limited to these descriptive examples. The numerical values, structures, sizes, orientations, position, placement, and the like may be changed to accommodate specific imaging conditions. The design, optimization, and analysis methods for the invention can be incorporated into a lithographic simulator, a design layout tool, a computer program, or other analysis tools.

The invention claimed is:

1. A method for detecting and measuring aberrations in an aerial image measurement system (AIMS) comprising:
    placing the test target in an object plane of a projection system having aberrations that distort an image;
    providing a test target with at least one open figure including a multiple component array of phase zones, wherein the multiple phase zones are resolvable by the optical system and are arranged within the open figure so that their responses to lens aberrations are interrelated and the phase zones respond uniquely to specific aberrations depending on their location within the figure;
    projecting an image of the test target onto a digital image capture device;
    comparing the captured target image to a digital reference image without aberrations; and
    adding aberrations to the digital reference image to modify the digital reference image to thereby determine the type and levels of aberrations in the system that produce the deformed image.

2. The method of claim 1 wherein size of the phase zones and the spaces between the phase zones are between $0.52\lambda/NA$ to $1.5\lambda/NA$ where $\lambda$ is the wavelength of the light exposing the target and NA is the numerical aperture of the exposure system.

3. The method of claim 1 wherein the size of the target is between $2.0\lambda/NA$ to $6.0\lambda/NA$ where $\lambda$ is the wavelength of the light exposing the target and NA is the numerical aperture of the exposure system.

4. The method of claim 1 wherein the phase zones are 180 degrees out of phase with respect to the rest of the target.

5. The method of claim 1 wherein the phase zones are etched into the surface of the target.

6. The method of claim 1 wherein the phase zones comprise at least two zones with one phase zone larger than the other phase zone.

7. The method of claim 1 wherein the phase zones comprise at least two zones of substantially the same size.

8. The method of claim 1 wherein the phase zones comprise a central phase zone and plurality of circumferential phase zones wherein the central phase zone is larger than the circumferential phase zones.

9. The method of claim 1 wherein the phase zones comprise a central phase zone and plurality of circumferential phase zones wherein the central phase zone is substantially the same size as the circumferential phase zones.

10. The method of claim 1 wherein the phase zones comprise a central phase zone and plurality of circumferential phase zones wherein the central phase zone is smaller than the circumferential phase zones.

11. The method of claim 1 wherein each phase zone is circular, rectangular, elliptical, or hexagonal.

12. The method of claim 1 wherein the target comprises a central phase zone and eight circumferential phase zones equally angularly spaced from each other for detecting astigmatism, coma, spherical aberration and three point aberration.

13. The method of claim 1 wherein the test target has at least two circumferential phase zones spaced 180 degrees apart from each other for detecting positive or negative lens aberration.

14. The method of claim 1 wherein the test target has at least two more circumferential phase zones spaced 180 apart from each other and 90 degrees from the first two circumferential phase zones for detecting positive and negative lens aberration.

15. The method of claim 13 wherein the test target has at least four circumferential phase zones located at 0, 90, 180, 270 degrees and two more phase zones at 135 and 315 degrees or 45 and 225 degrees to detect 45 degree astigmatism.

16. The method of claim 13 wherein the test target has phase zones with similar or different shapes.

17. The method of claim 1 wherein the test target has phase zones with circular, rectangular, elliptical, pentagonal, triangular or hexagonal shapes.

18. The method of claim 1 wherein the test target has phase zones with the same shape.

19. The method of claim 1 wherein the test target has a central phase zone with one shape and circumferential phase zones with a different shape.

20. The method of claim 1 wherein the differences between the detected image and the reference image indicate the type and degree of aberration.

21. The method of claim 1 wherein the optical system comprises a micro-projection inspection system for imaging a test target carrying a pattern for a microelectronic device.

22. The method of claim 1 wherein adding aberrations to the digital reference image reduces differences between the captured target images and the modified digital reference image.

23. The method of claim 1 wherein the detection device is a charged coupled device.

24. The method of claim 1 wherein the detection device is a charge injection device.

25. The method of claim 1 wherein the detection device is a photodiode array.

26. The method of claim 1 comprising the further step of displaying the captured target image.

* * * * *